(12) United States Patent
Zhang

(10) Patent No.: US 12,512,444 B2
(45) Date of Patent: Dec. 30, 2025

(54) SEMICONDUCTOR STRUCTURE AND METHOD FOR MANUFACTURING THE SAME

(71) Applicant: ENKRIS SEMICONDUCTOR, INC., Jiangsu (CN)

(72) Inventor: Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 386 days.

(21) Appl. No.: 18/457,048

(22) Filed: Aug. 28, 2023

(65) Prior Publication Data

US 2024/0313156 A1  Sep. 19, 2024

(30) Foreign Application Priority Data

Mar. 16, 2023 (CN) .......................... 202310257366.6

(51) Int. Cl.
| | |
|---|---|
| *H01L 25/075* | (2006.01) |
| *H10H 20/819* | (2025.01) |
| *H10H 29/80* | (2025.01) |
| *H10H 29/85* | (2025.01) |

(52) U.S. Cl.
CPC ...... *H01L 25/0756* (2013.01); *H01L 25/0753* (2013.01); *H10H 20/819* (2025.01); *H10H 29/857* (2025.01); *H10H 29/962* (2025.01)

(58) Field of Classification Search
CPC . H01L 25/0753; H10H 20/857; H10H 29/857
See application file for complete search history.

(56) References Cited

U.S. PATENT DOCUMENTS

| | | | | |
|---|---|---|---|---|
| 2017/0323873 | A1* | 11/2017 | Lin | ......................... H01L 24/06 |
| 2019/0164944 | A1* | 5/2019 | Chae | ....................... H01L 25/13 |
| 2019/0189596 | A1 | 6/2019 | Chae et al. | |

FOREIGN PATENT DOCUMENTS

| | | |
|---|---|---|
| CN | 1619846 A | 5/2005 |
| CN | 109585618 A | 4/2019 |
| CN | 108269890 B | 6/2019 |
| CN | 110246953 A | 9/2019 |
| CN | 110690248 A | 1/2020 |

\* cited by examiner

*Primary Examiner* — Yu Chen

(74) *Attorney, Agent, or Firm* — Christopher R. Carroll; The Small Patent Law Group LLC

(57) ABSTRACT

A semiconductor structure and a method for manufacturing a semiconductor structure are provided. The semiconductor structure includes a driving substrate, a first epitaxial structure coupled to the driving substrate, and a second epitaxial structure coupled to the first epitaxial structure, where the driving substrate is selectively coupled to a first semiconductor layer and a second semiconductor layer of the first epitaxial structure, and a third semiconductor layer and a fourth semiconductor layer of the second epitaxial structure by metal electrodes to independently control the first epitaxial structure and the second epitaxial structure.

17 Claims, 9 Drawing Sheets

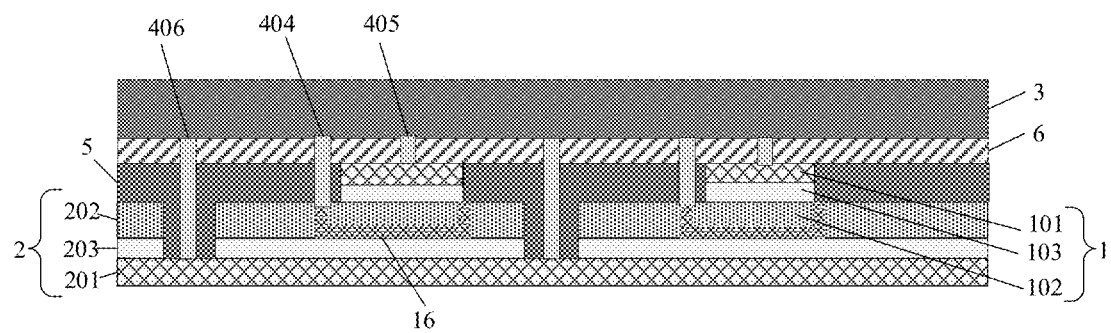
FIG. 11
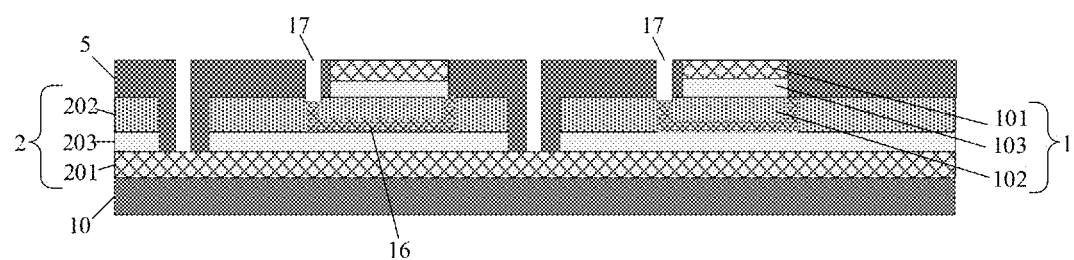
FIG. 12
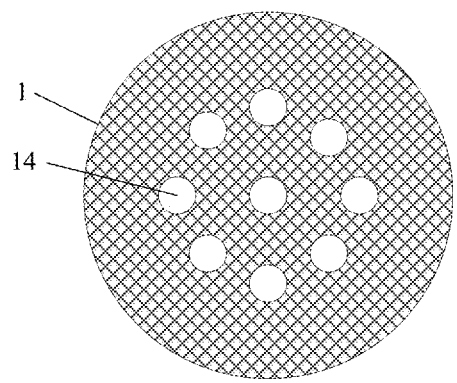    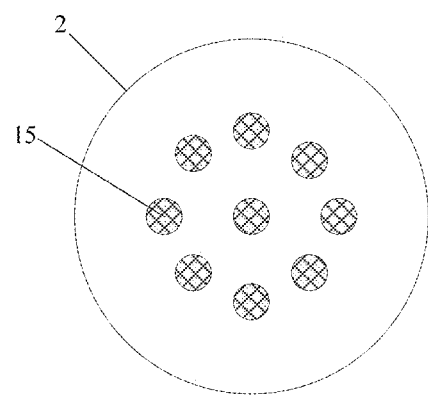
FIG. 13A                FIG. 13B

SEMICONDUCTOR STRUCTURE AND METHOD FOR MANUFACTURING THE SAME

CROSS REFERENCE TO RELATED APPLICATIONS

This application claims priority to Chinese Patent Application No. 202310257366.6, filed on Mar. 16, 2023, the entire content of which is incorporated herein by reference.

TECHNICAL FIELD

The present disclosure relates to the field of semiconductors, in particular to a semiconductor structure and a method for manufacturing a semiconductor structure.

BACKGROUND

With the development of technology, semiconductor devices have attracted more and more attention. A light-emitting diode (LED) emits visible light through the recombination between electrons and holes. The LED is widely used in lighting, backlighting and display applications.

In the field of LED backlighting, usually, a white LED is formed as a backlight by adding fluorescent powder to a blue LED for application in the display field. However, the LED backlight chip manufactured by this method has a problem of low colour gamut due to the fact that the emitting unit is only monochromatic, resulting in low colour fidelity of the display.

In the field of LED display, the light-emitting layer of the LED is usually achieved by wavelength conversion using fluorescent powder or quantum dots, such as blue LED paired with red and green fluorescent powder. However, the LED full-colour chip manufactured by this method has a low efficiency of exciting green phosphor with blue light, and the green phosphor production cost is high. In related arts, the LED full-colour chip can also be manufactured by integrating red, green and blue light-emitting units on the same substrate by peel-bonding, but the manufacturing method is cumbersome in steps and costly.

To solve the above problems, a LED simultaneously emitting light with two wavelengths can be used, combined with red phosphor, to realize the white backlight of LED with high colour rendering index or a LED full-colour chip. However, it is difficult for the current technology to realize light-emitting units with two main light-emitting wavelengths simultaneously on the same driving substrate.

SUMMARY

The present disclosure provides a semiconductor structure and a method for manufacturing a semiconductor structure. On the one hand, two light-emitting units with two main light-emitting wavelengths can be realized on the same driving substrate at the same time, thereby the white backlight of LED with high colour rendering index is realized; on the other hand, the independent control of two light-emitting units is realized, and the full-colour display of LED is realized.

According to a first aspect of the present disclosure, there is provided a semiconductor structure, including: a driving substrate, a first epitaxial structure, coupled to the driving substrate, where the first epitaxial structure includes a first semiconductor layer, a second semiconductor layer and a first light-emitting layer disposed between the first semiconductor layer and the second semiconductor layer, the first semiconductor layer has a conductivity type opposite to that of the second semiconductor layer, and the first semiconductor layer is disposed at a side of the first epitaxial structure near the driving substrate; and a second epitaxial structure, coupled to the first epitaxial structure, where the second epitaxial structure includes a third semiconductor layer, a fourth semiconductor layer and a second light-emitting layer disposed between the third semiconductor layer and the fourth semiconductor layer, the third semiconductor layer has a conductivity type opposite to that of the fourth semiconductor layer, the conductivity type of the second semiconductor layer is the same as that of the fourth semiconductor layer, and the fourth semiconductor layer is disposed at a side of the second epitaxial structure near the first epitaxial structure such that the fourth semiconductor layer is coupled to the second semiconductor layer, where the driving substrate is selectively coupled to the first semiconductor layer, the second semiconductor layer, the third semiconductor layer and the fourth semiconductor layer by metal electrodes to independently control the first epitaxial structure and the second epitaxial structure.

In an embodiment, the semiconductor structure further includes a transparent conductive layer, which is disposed between the first epitaxial structure and the second epitaxial structure.

In an embodiment, the driving substrate is coupled to the first semiconductor layer, the third semiconductor layer, and one of the second semiconductor layer and the fourth semiconductor layer by metal electrodes.

In an embodiment, the semiconductor structure further includes a first channel and a second channel, where the first channel extends from a surface of the first semiconductor layer to the second semiconductor layer or the fourth semiconductor layer such that the driving substrate is coupled to the second semiconductor layer or the fourth semiconductor layer by a first electrode in the first channel, the second channel extends from the surface of the first semiconductor layer to the third semiconductor layer such that the driving substrate is coupled to the third semiconductor layer by a second electrode in the second channel, and the driving substrate is directly coupled to the first semiconductor layer by a third electrode.

In an embodiment, the semiconductor structure further includes an insulating layer, which is disposed on the surface of the first semiconductor layer and on surfaces of inner side walls of the first channel and the second channel.

In an embodiment, the semiconductor structure further includes a reflector layer, which is disposed between the first semiconductor layer and the insulating layer.

In an embodiment, a material of the transparent conductive layer includes indium tin oxide.

In an embodiment, the first epitaxial structure has a first patterning structure, the second epitaxial structure has a second patterning structure corresponding to the first patterning structure, and the first epitaxial structure and the second epitaxial structure are coupled to each other by engaging the first patterning structure with the second patterning structure.

In an embodiment, the second semiconductor layer is in the same horizontal position as the fourth semiconductor layer, the second semiconductor layer and the fourth semiconductor layer adjacent to the second semiconductor layer are exposed simultaneously through a third channel such that the second semiconductor layer and the fourth semiconductor layer adjacent to the second semiconductor layer are jointly coupled to the driving substrate by a fourth electrode, and the first semiconductor layer and the third semiconductor layer are coupled to the driving substrate by a fifth electrode and a sixth electrode, respectively.

In an embodiment, the second semiconductor layer is not in the same horizontal position as the fourth semiconductor layer, the first semiconductor layer is coupled to the driving substrate by a seventh electrode, the second semiconductor layer is coupled to the driving substrate by an eighth electrode, the third semiconductor layer is coupled to the driving substrate by a ninth electrode, and the fourth semiconductor layer is coupled to the driving substrate by a tenth electrode.

In an embodiment, the semiconductor structure further includes a passivation layer, which is disposed between the first epitaxial structure and the second epitaxial structure.

In an embodiment, the semiconductor structure further includes a protection layer, which is disposed between an overall structure formed by coupling the first epitaxial structure and the second epitaxial structure and the driving substrate.

In an embodiment, materials of the first semiconductor layer, the second semiconductor layer, the third semiconductor layer and the fourth semiconductor layer include a group III nitride material.

In an embodiment, the semiconductor structure further includes a third epitaxial structure, having a third patterning structure corresponding to the second patterning structure, where the third epitaxial structure and the second epitaxial structure are coupled to each other by engaging the second patterning structure with the third patterning structure.

In an embodiment, the third epitaxial structure is coupled to the driving substrate, the third epitaxial structure includes a fifth semiconductor layer, a third light-emitting layer and a sixth semiconductor layer stacked, the fifth semiconductor layer is disposed at a side of the third epitaxial structure near the driving substrate, the fifth semiconductor layer has a conductivity type opposite to that of the sixth semiconductor layer, and wavelengths of light emitted from the first light-emitting layer, the second light-emitting layer and the third light-emitting layer are different from each other.

According to a second aspect of the present disclosure, there is provided a method for manufacturing a semiconductor structure, including:

providing a first epitaxial structure, where the first epitaxial structure includes a first semiconductor layer, a second semiconductor layer and a first light-emitting layer disposed between the first semiconductor layer and the second semiconductor layer, and the first semiconductor layer has a conductivity type opposite to that of the second semiconductor layer;

providing a second epitaxial structure coupled to the first epitaxial structure, where the second epitaxial structure includes a third semiconductor layer, a fourth semiconductor layer and a second light-emitting layer disposed between the third semiconductor layer and the fourth semiconductor layer, the third semiconductor layer has a conductivity type opposite to that of the fourth semiconductor layer, the conductivity type of the second semiconductor layer is the same as that of the fourth semiconductor layer, and the fourth semiconductor layer is disposed at a side of the second epitaxial structure near the first epitaxial structure such that the fourth semiconductor layer is coupled to the second semiconductor layer;

selectively exposing the first semiconductor layer, the second semiconductor layer, the third semiconductor layer and the fourth semiconductor layer by etching;

providing a driving substrate bonded to a side of the first epitaxial structure away from the second epitaxial structure; and selectively coupling the driving substrate to the first semiconductor layer, the second semiconductor layer, the third semiconductor layer and the fourth semiconductor layer by metal electrodes to independently control the first epitaxial structure and the second epitaxial structure.

In an embodiment, coupling the second epitaxial structure to the first epitaxial structure includes:

coupling the first epitaxial structure and the second epitaxial structure by directly bonding the second semiconductor layer to the fourth semiconductor layer: or coupling the first epitaxial structure and the second epitaxial structure by a transparent conductive layer provided between the second semiconductor layer and the fourth semiconductor layer.

In an embodiment, the method further includes, before coupling the second epitaxial structure to the first epitaxial structure:

patterning the first epitaxial structure and the second epitaxial structure, such that the first epitaxial structure has a first patterning structure and the second epitaxial structure has a second patterning structure corresponding to the first patterning structure, and the first epitaxial structure and the second epitaxial structure are coupled to each other by engaging the first patterning structure with the second patterning structure.

In an embodiment, providing the first epitaxial structure includes: providing a first substrate, and forming the first semiconductor layer, the first light-emitting layer and the second semiconductor layer sequentially on the first substrate.

In an embodiment, providing the second epitaxial structure includes: providing a second substrate, and forming the third semiconductor layer, the second light-emitting layer and the fourth semiconductor layer sequentially on the second substrate.

In an embodiment, the method further includes, after coupling the second epitaxial structure to the first epitaxial structure: removing the first substrate and the second substrate.

The method further includes, after coupling the first epitaxial structure and the second epitaxial structure by engaging the first patterning structure with the second patterning structure:

providing a third epitaxial structure:

patterning the third epitaxial structure, such that the third epitaxial structure has a third patterning structure corresponding to the second patterning structure; and bonding the third epitaxial structure to the second epitaxial structure by engaging the third patterning structure with the second patterning structure.

BRIEF DESCRIPTION OF DRAWINGS

FIG. 11 is a schematic diagram illustrating a semiconductor structure according to a fifth embodiment of the present disclosure.

FIG. 12 is a schematic diagram illustrating an intermediate structure corresponding to a step of etching in the process of manufacturing the semiconductor structure shown in FIG. 11.

FIGS. 13A to 13F exemplarily illustrate three forms of a first protrusion of the first epitaxial structure and three forms of a groove of the second epitaxial structure according to embodiments of the present disclosure.

Figure 1:
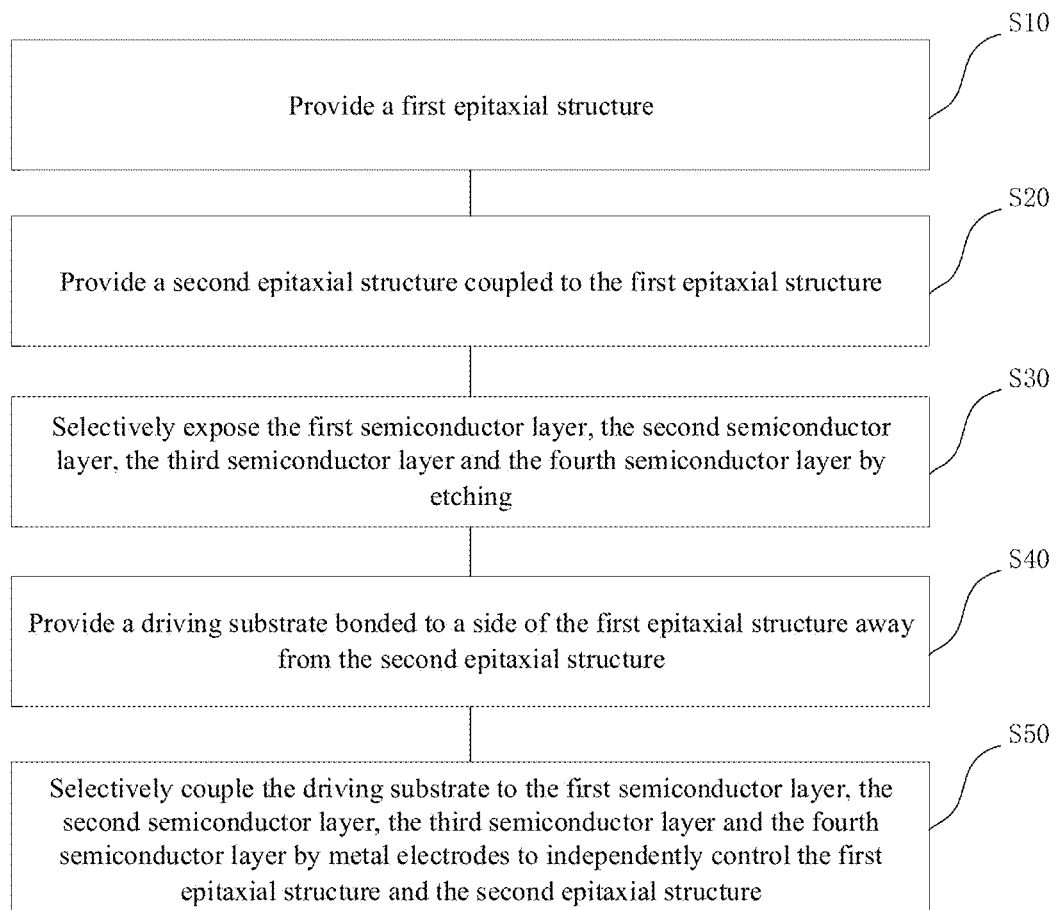
FIG. 1 is a flowchart illustrating a method for manufacturing a semiconductor structure according to an embodiment of the present disclosure.

For the convenience of understanding of the present disclosure, all reference numerals appearing in the present disclosure are listed below:

first epitaxial structure 1: first semiconductor layer 101: second semiconductor layer 102: first light-emitting layer 103: second epitaxial structure 2: third semiconductor layer 201; fourth semiconductor layer 202: second light-emitting layer 203: driving substrate 3: first electrode 401: second electrode 402: third electrode 403: fourth electrode 404: fifth electrode 405: sixth electrode 406; seventh electrode 407: eighth electrode 408: ninth electrode 409; tenth electrode 410: eleventh electrode 411: twelfth electrode 412: insulating layer 5: protection layer 6: transparent conductive layer 7: first substrate 9): second substrate 10; first channel 11: second channel 12: reflector layer 13: first protrusion 14: groove 15: passivation layer 16; third channel 17: third epitaxial structure 18: fifth semiconductor layer 181; sixth semiconductor layer 182; third light-emitting layer 183: third substrate 19.

DETAILED DESCRIPTION

Examples will be described in detail herein with the examples thereof expressed in the drawings. Where the following description relates to the drawings, unless otherwise indicated, the same numerals in different drawings represent the same or similar elements. The embodiments described in the following exemplary embodiments do not represent all embodiments consistent with the present disclosure. Rather, they are merely device examples consistent with some aspects of the present disclosure as detailed in the appended claims.

The terms used herein are for the purpose of describing particular embodiments only and are not intended to be limiting of the present disclosure. Unless otherwise defined, the technical or scientific terms used in the present disclosure shall have the usual meanings understood by those of ordinary skill in the field to which the present disclosure belongs. The terms "first", "second", and similar terms used in the description and claims of the present disclosure do not indicate any of order, quantity, and importance, but are only used to distinguish different components. Similarly, the wordings such as "a" or "an" do not indicate a quantitative limitation, but rather indicate the existence of at least one. The wording "Multiple" or "several" means two or more. Unless otherwise stated, the terms such as "front", "rear", "lower", and/or "upper" are for ease of description only and are not limited to a position or a spatial orientation. Terms such as "include" or "comprise", and the like, are intended to mean that an element or object appearing before "include" or "comprise" covers an element or object appearing after "include" or "comprise" and its equivalents, and do not exclude other elements or objects. Terms such as "connect" or "couple", and the like, are not limited to physical or mechanical connections, but may include electrical connections, whether directly or indirectly. As used herein, the singular forms "a", "said" and "the" are intended to include the plural forms as well, unless the context clearly indicates otherwise. It should also be understood that the term "and/or" as used herein refers to and includes any or all combinations of one or more of the associated listed items.

First Embodiment

As shown in FIGS. 1 to 4, the embodiments of the present disclosure provide a semiconductor structure and a method for manufacturing the same.

Figure 3:
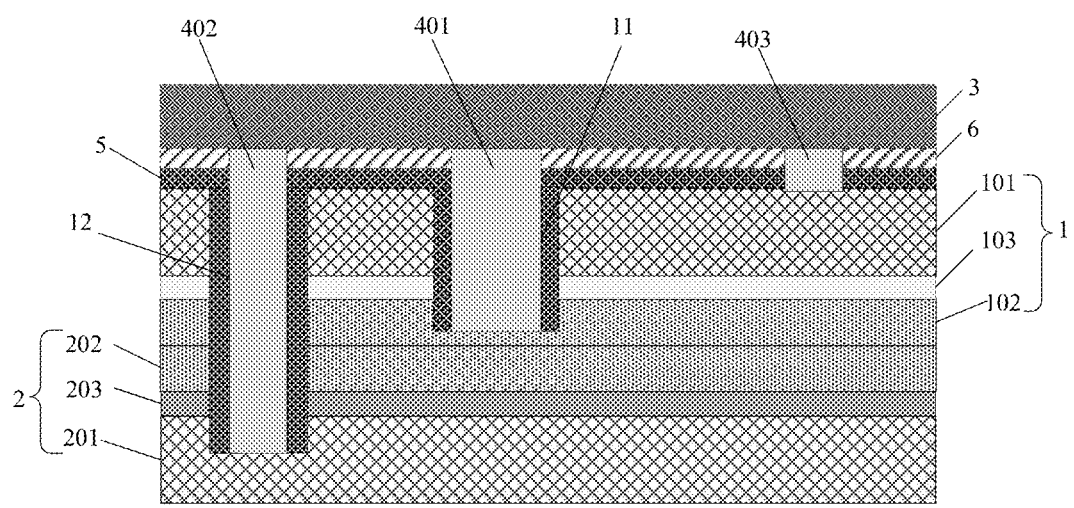
FIG. 3 is a schematic diagram illustrating a semiconductor structure according to a first embodiment of the present disclosure.

As shown in FIG. 3, the semiconductor structure includes: a driving substrate 3, a first epitaxial structure 1, coupled to the driving substrate 3, where the first epitaxial structure 1 includes a first semiconductor layer 101, a second semiconductor layer 102 and a first light-emitting layer 103 disposed between the first semiconductor layer 101 and the second semiconductor layer 102, the first semiconductor layer 101 has a conductivity type opposite to that of the second semiconductor layer 102, and the first semiconductor layer 101 is disposed at a side of the first epitaxial structure 1 near the driving substrate 3; and a second epitaxial structure 2, coupled to the first epitaxial structure 1, where the second epitaxial structure 2 includes a third semiconductor layer 201, a fourth semiconductor layer 202 and a second light-emitting layer 203 disposed between the third semiconductor layer 201 and the fourth semiconductor layer 202, the third semiconductor layer 201 has a conductivity type opposite to that of the fourth semiconductor layer 202, the conductivity type of the second semiconductor layer 102 is the same as that of the fourth semiconductor layer 202, and the fourth semiconductor layer 202 is disposed at a side of the second epitaxial structure 2 near the first epitaxial structure 1 such that the fourth semiconductor layer 202 is coupled to the second semiconductor layer 102, where the driving substrate 3 is coupled to the first semiconductor layer 101, the second semiconductor layer 102, the third semiconductor layer 201 and the fourth semiconductor layer 202 by metal electrodes to independently control the first epitaxial structure 1 and the second epitaxial structure 2. The driving substrate 3 may be a driving circuit.

On the one hand, by coupling the first epitaxial structure 1 to the driving substrate 3 and coupling the second epitaxial structure 2 to the first epitaxial structure 1, two light-emitting units (the first epitaxial structure 1 and the second epitaxial structure 2) with two main light-emitting wavelengths on the same driving substrate 3 are realized, thereby the white backlight of LED with high colour rendering index is realized, and the two light-emitting units are processed synchronously, such that the processing procedure is simplified and the manufacturing cost is saved. On the other hand, by coupling the driving substrate 3 to the first semiconductor layer 101, the second semiconductor layer 102, the third semiconductor layer 201 and the fourth semiconductor layer 202, the first epitaxial structure 1 and the second epitaxial structure 2 (two light-emitting units) can be independently controlled to achieve independent light emission from the two light-emitting units and thus achieve a full-colour display of the LED.

The first epitaxial structure 1 and the second epitaxial structure 2 (as two light-emitting units) have two different light-emitting wavelengths, and the colour gamut range of the LED backlight chip can be obviously improved through the light-emitting units with two different main light-emitting wavelengths. In this embodiment, the wavelength of light emitted from the first epitaxial structure 1 closer to the driving substrate 3 is greater than that of the second epitaxial structure 2, and the semiconductor structure provided by this embodiment can emit white light or display in full-colour. For example, to realize the white backlight of LED, the first epitaxial structure 1 can be a green light unit, and the second epitaxial structure 2 can be a blue light unit, which can be specifically selected as required in specific applications, and is not limited to thereto.

According to the first embodiment of the present disclosure, the first semiconductor layer 101 and the third semiconductor layer 201 may both be N-type semiconductor layers, and the second semiconductor layer 102 and the fourth semiconductor layer 202 may both be P-type semiconductor layers. Alternatively, the first semiconductor layer 101 and the third semiconductor layer 201 may both be P-type semiconductor layers, and the second semiconductor layer 102 and the fourth semiconductor layer 202 may both be N-type semiconductor layers. Materials of the first semiconductor layer 101, the second semiconductor layer 102, the third semiconductor layer 201 and the fourth semiconductor layer 202 include a group III nitride material.

For example, the first semiconductor layer 101 and the third semiconductor layer 201 may both be N-type semiconductor layers, and the second semiconductor layer 102 and the fourth semiconductor layer 202 may both be P-type semiconductor layers.

The materials of the first semiconductor layer 101 and the third semiconductor layer 201 may be, for example, a N-type group III nitride material. The N-type doping element may include at least one of Si, Ge, Sn, Se or Te. The group III nitride material may include any one or combination of GaN, AlGaN, InGaN and AlInGaN.

The process of manufacturing the N-type semiconductor layer may include: atomic layer deposition (ALD), chemical vapor deposition (CVD), molecular beam epitaxy (MBE), plasma enhanced chemical vapor deposition (PECVD), low pressure chemical vapor deposition (LPCVD), or metal organic compound chemical vapor deposition (MOCVD), or a combination thereof.

The materials of the second semiconductor layer 102 and the fourth semiconductor layer 202 may be, for example, a P-type group III nitride material. The P-type doping element may include at least one of Mg. Zn, Ca Sr or Ba. The group III nitride material may include any one or combination of GaN, AlGaN, InGaN and AlInGaN.

The process of manufacturing the P-type semiconductor layer can refer to the process of manufacturing the N-type semiconductor layer.

The first light-emitting layer 103 and the second light-emitting layer 203 may include at least one of a single quantum well structure, a multiple quantum well (MQW) structure, a quantum wire structure or a quantum dot structure. The first light-emitting layer 103 and the second light-emitting layer 203 may include a well layer and a barrier layer formed by the group III nitride material. The group III nitride material may include any one or combination of GaN, AlGaN, InGaN and AlInGaN.

For example, the well layer may include an $Al_xGa_{1-x}N$ layer, where x represents the percentage of the mass of Al element to the sum of the mass of Al element and Ga element, and $1 \geq x \geq 0$ and/or the barrier layer may include an $Al_yGa_{1-y}N$ layer, where y represents the percentage of the mass of Al element to the sum of the mass of Al element and Ga element, and $1 \geq y \geq 0$. The band gap width of the well layer is smaller than that of the barrier layer.

In this embodiment, the first light-emitting layer 103 and the second light-emitting layer 203 may include an In component, and the amount of the In component in the first light-emitting layer 103 is more than that in the second light-emitting layer 203. In specific applications, the amount of In component can be selected according to needs, for example, the amount of In component in the first light-emitting layer 103 is less than or equal to that in the second light-emitting layer 203, and the present disclosure is not limited to thereto.

The process of manufacturing the well layer and the barrier layer can refer to the process of manufacturing the N-type semiconductor layer.

The well layer and/or the barrier layer may or may not be doped with Al. The quality of crystallization can be improved without doping Al, but the resistance can be reduced by doping Al.

A multi-quantum well structure can be formed by stacking the well layers and the barrier layers alternately, such that the efficiency of emitting light is improved.

Figure 4:
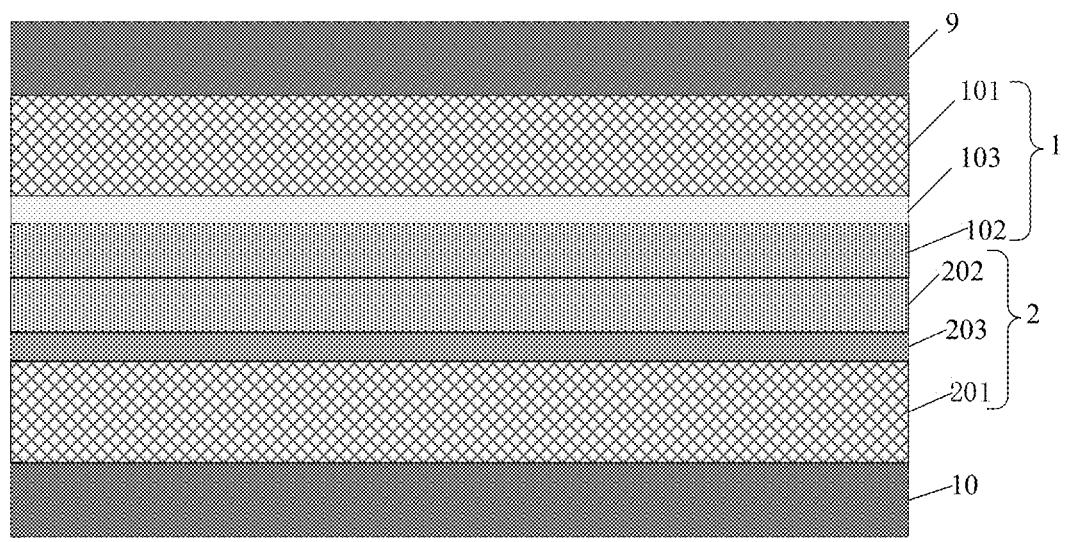
FIG. 4 is a schematic diagram illustrating an intermediate structure corresponding to a step of coupling the first epitaxial structure and the second epitaxial structure in the process of manufacturing the semiconductor structure shown in FIG. 3.

According to the first embodiment of the present disclosure, the first epitaxial structure 1 and the second epitaxial structure 2 are coupled by directly bonding the second semiconductor layer 102 and the fourth semiconductor layer 202, as shown in FIGS. 3 to 4.

According to the first embodiment of the present disclosure, the driving substrate 3 as a conductive substrate is coupled to the first semiconductor layer 101, the third semiconductor layer 201, and one of the second semiconductor layer 102 and the fourth semiconductor layer 202 by metal electrodes.

The first semiconductor layer 101, the third semiconductor layer 201, and one of the second semiconductor layer 102 and the fourth semiconductor layer 202 are independently coupled to the driving substrate 3 through respective metal electrodes, so that two light-emitting units can be independently controlled, that is, the first epitaxial structure 1 and the second epitaxial structure 2 can be independently controlled, thereby the full-colour display of the LED backlight chip is realized.

In an embodiment, the semiconductor structure further includes a first channel 11 and a second channel 12. The first channel 11 extends from a surface of the first semiconductor layer 101 to the second semiconductor layer 102 or the fourth semiconductor layer 202, such that the driving substrate 3 is coupled to the second semiconductor layer 102 or the fourth semiconductor layer 202 by a first electrode 401 in the first channel 11. The second channel 12 extends from the surface of the first semiconductor layer 101 to the third semiconductor layer 201, such that the driving substrate 3 is coupled to the third semiconductor layer 201 by a second electrode 402 in the second channel 12, and the driving substrate 3 is directly coupled to the first semiconductor layer 101 by a third electrode 403.

As shown in FIG. 3, in the first embodiment of the present disclosure, the first channel 11 extends from the surface of the first semiconductor layer 101 to the second semiconductor layer 102. Since the fourth semiconductor layer 202 is directly bonded to the second semiconductor layer 102, the fourth semiconductor layer 202 can share the first electrode 401 with the second semiconductor layer 102 to couple to the driving substrate 3.

An insulating layer 5 is provided on the surface of the first semiconductor layer 101 and on surfaces of inner side walls of the first channel 11 and the second channel 12. The insulating layer 5 may include silicon dioxide, silicon nitride and other materials.

As shown in FIG. 1, according to the first embodiment of the present disclosure, a method for manufacturing the semiconductor structure includes: the following steps S10 to S40.

At S10, a first epitaxial structure 1 is provided.

At S20, a second epitaxial structure 2 coupled to the first epitaxial structure 1 is provided.

At S30, the first semiconductor layer 101, the second semiconductor layer 102, the third semiconductor layer 201 and the fourth semiconductor layer 202 are selectively exposed by etching the first epitaxial structure 1 and the second epitaxial structure 2.

At S40, a driving substrate 3 bonded to a side of the first epitaxial structure 1 away from the second epitaxial structure 2 is provided; and the driving substrate 3 is coupled to the first semiconductor layer 101, the second semiconductor layer 102, the third semiconductor layer 201 and the fourth semiconductor layer 202 by metal electrodes to independently control the first epitaxial structure 1 and the second epitaxial structure 2.

Figure 2A:
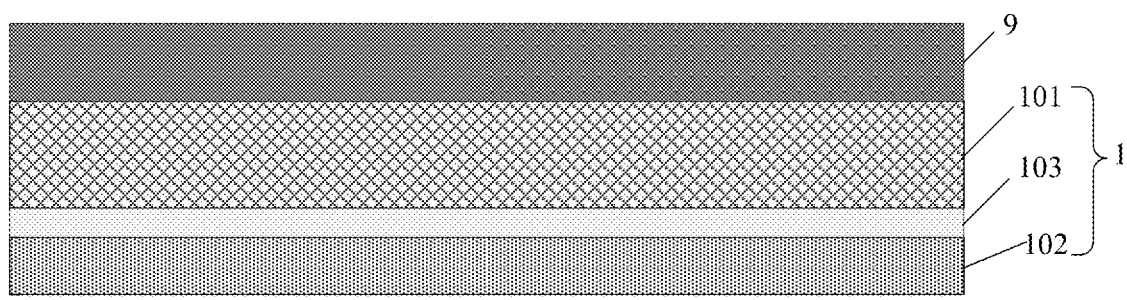
FIGS. 2A and 2B are schematic diagrams illustrating a first epitaxial structure and a second epitaxial structure provided by the method in FIG. 1.

In step S10, providing the first epitaxial structure 1 includes: providing a first substrate 9, and forming the first semiconductor layer 101, the first light-emitting layer 103 and the second semiconductor layer 102 sequentially on the first substrate 9, as shown in FIG. 2A.

Figure 2B:
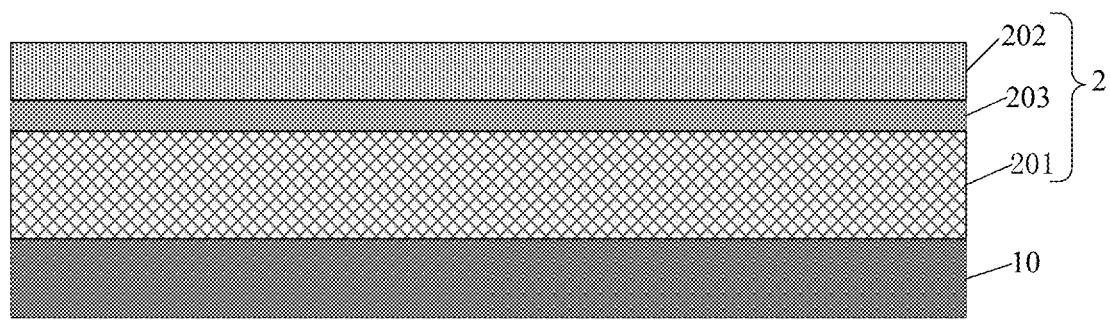

In step S20, providing the second epitaxial structure 2 includes: providing a second substrate 10, and forming the third semiconductor layer 201, the second light-emitting layer 203 and the fourth semiconductor layer 202 sequentially on the second substrate 10, as shown in FIG. 2B.

The method further includes, after coupling the second epitaxial structure 2 to the first epitaxial structure 1: removing the first substrate 9.

The materials of the first substrate 9 and the second substrate 10 may be one or more of sapphire, silicon carbide, silicon, diamond, or GaN.

According to the first embodiment of the present disclosure, in step S30, etching the first epitaxial structure 1 and the second epitaxial structure 2 to expose the first semiconductor layer 101, the second semiconductor layer 102, the third semiconductor layer 201, and the fourth semiconductor layer 202 specifically includes, after removing the first substrate 9: lithographing the first epitaxial structure 1 to form the first channel 11 and the second channel 12, such that the first channel 11 extends into the second semiconductor layer 102, and the second channel 12 extends into the third semiconductor layer 201.

After the first channel 11 and the second channel 12 are formed, an insulating layer 5 may be deposited on a surface of the first semiconductor layer 101 and bottoms of the first channel 11 and the second channel 12 and surfaces of inner side walls of the first channel 11 and the second channel 12 for isolation protection. Before the first electrode 401, the second electrode 402, and the third electrode 403 are manufactured, the insulating layer 5 disposed at the bottoms of the first channel 11 and the second channel 12 and a part of the insulating layer 5 disposed on the surface of the first semiconductor layer 101 are removed to reserve regions for providing the first electrode 401, the second electrode 402, and the third electrode 403.

In some examples, a protection layer 6 may be deposited on an upper surface of the insulating layer 5 for further depositing the first electrode 401, the second electrode 402, and the third electrode 403, such that the second semiconductor layer 102 and the fourth semiconductor layer 202 are coupled to the driving substrate 3 via the first electrode 401, the third semiconductor layer 201 is coupled to the driving substrate 3 via the second electrode 402, and the first semiconductor layer 101 is coupled to the driving substrate 3 via the third electrode 403. The material of the protection layer 6 includes a material such as $SiO_2$ or SiN.

After step S40, the method further includes: removing the second substrate 10.

Second Embodiment

Figure 5:
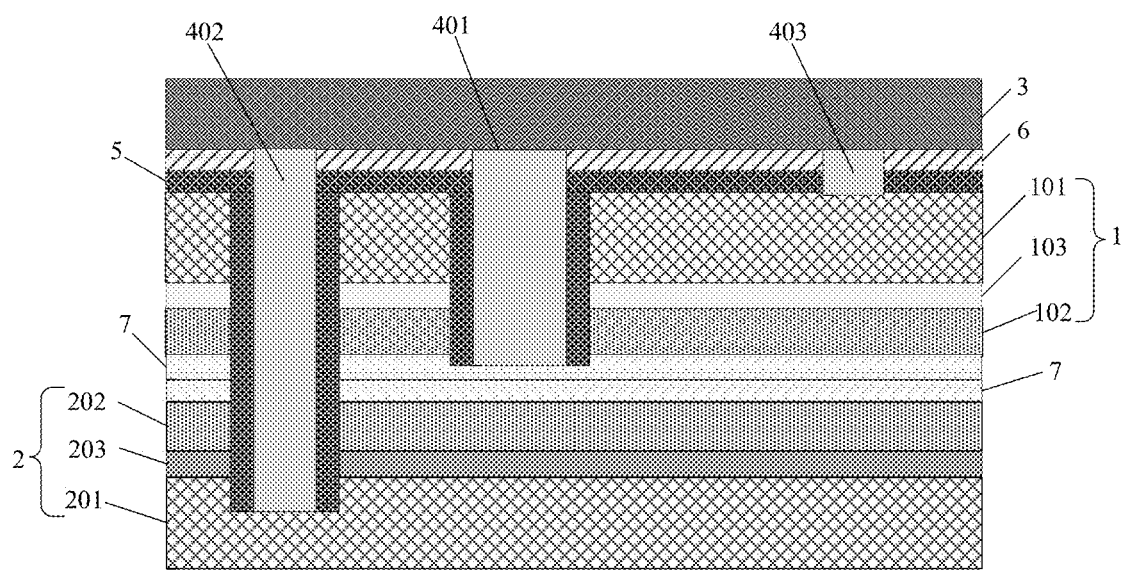
FIG. 5 is a schematic diagram illustrating a semiconductor structure according to a second embodiment of the present disclosure.
Figure 6:
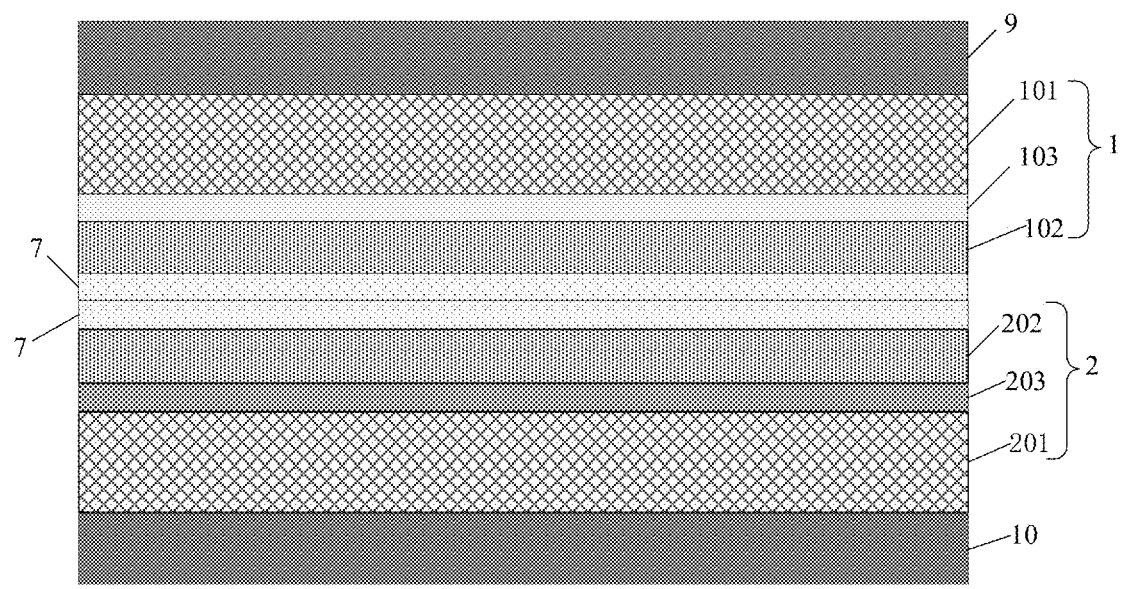
FIG. 6 is a schematic diagram illustrating an intermediate structure corresponding to a step of coupling the first epitaxial structure and the second epitaxial structure in the process of manufacturing the semiconductor structure shown in FIG. 5.
Figure 7:
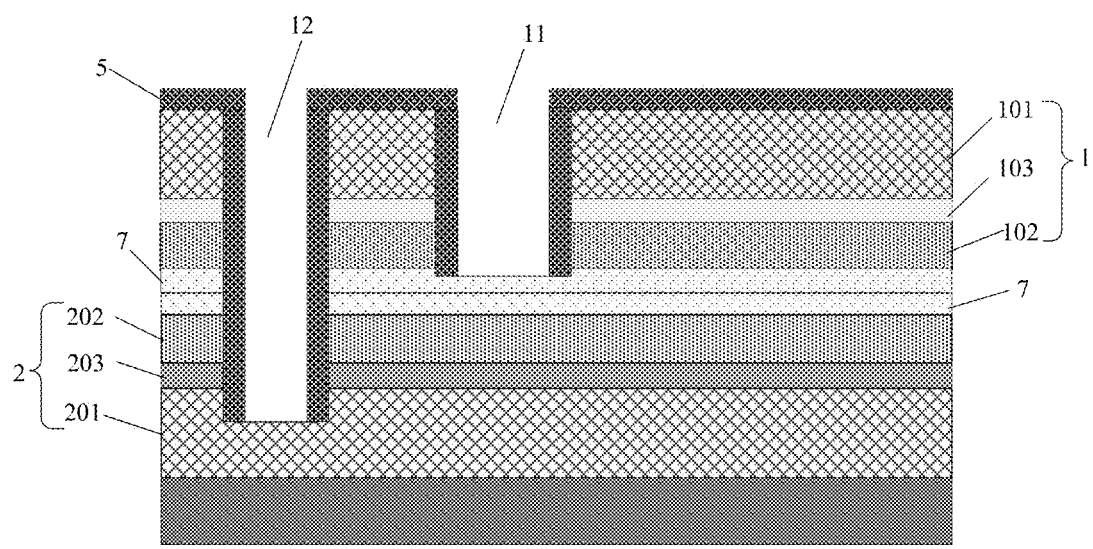
FIG. 7 is a schematic diagram illustrating an intermediate structure corresponding to a step of etching in the process of manufacturing the semiconductor structure shown in FIG. 5.

As shown in FIGS. 5 to 7, the second embodiment of the present disclosure provides a semiconductor structure that is substantially the same as the semiconductor structure of the first embodiment, with the difference being in that, in the second embodiment, the first epitaxial structure 1 and the second epitaxial structure 2 are coupled by a transparent conductive layer 7 provided between the second semiconductor layer 102 and the fourth semiconductor layer 202; the first channel 11 extends from the surface of the first semiconductor layer 101 into the transparent conductive layer 7. In this embodiment, the first channel 11 extends from the surface of the first semiconductor layer 101 into the transparent conductive layer 7, and the first electrode 401 is coupled to the second semiconductor layer 102 and the fourth semiconductor layer 202 through the transparent conductive layer 7 to improve conductivity and reduce resistance.

The material of the transparent conductive layer 7 includes indium tin oxide.

A method for manufacturing the semiconductor structure of the second embodiment is substantially the same as the method for manufacturing the semiconductor structure of the first embodiment, with the difference being in that, in the second embodiment, the method further includes: forming the transparent conductive layer 7 on the second semiconductor layer 102 and the fourth semiconductor layer 202, respectively, such that the first epitaxial structure 1 and the second epitaxial structure 2 are coupled by bonding of the two transparent conductive layers 7.

Third Embodiment

Figure 8:
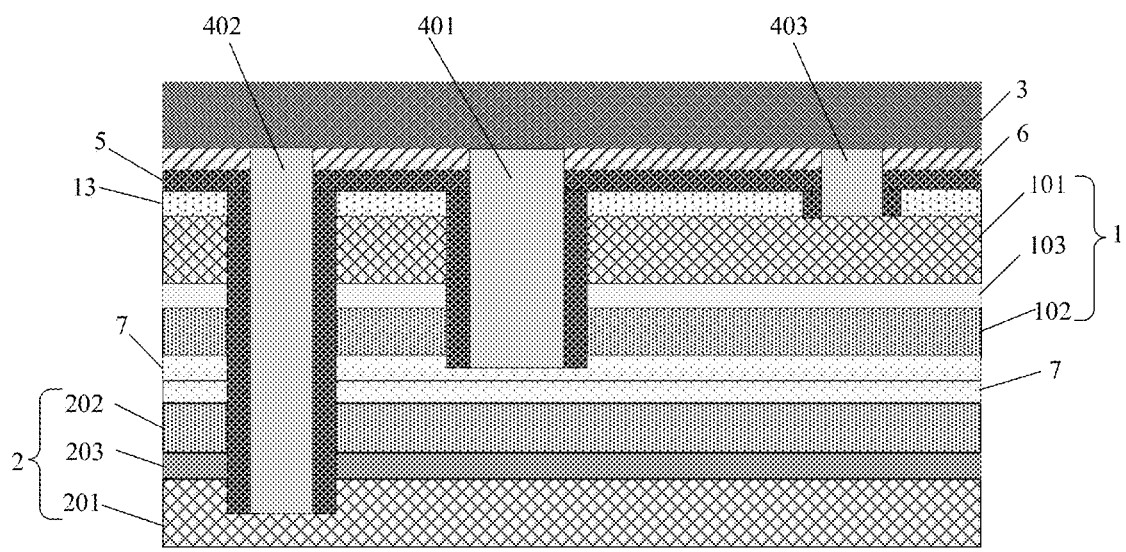
FIG. 8 is a schematic diagram illustrating a semiconductor structure according to a third embodiment of the present disclosure.

As shown in FIG. 8, the third embodiment of the present disclosure provides a semiconductor structure that is substantially the same as the semiconductor structure of the second embodiment, with the difference being in that, in the third embodiment, a reflector layer 13 is provided between the first semiconductor layer 101 and the insulating layer 5.

A method for manufacturing the semiconductor structure of the third embodiment is substantially the same as the method for manufacturing the semiconductor structure of the second embodiment, with the difference being in that, in the third embodiment, the method further includes: forming the reflector layer 13 on the surface of the first semiconductor layer 101 before the insulating layer 5 is formed. The reflector layer 13 includes an oxide material multi-layer structure or a group III nitride material multi-layer structure, where the oxide material multi-layer structure may include multiple layers formed by materials such as $SiO_2/TiO_2$, and the group III nitride material multi-layer structure may include multiple layers formed by materials such as AlGaN/GaN. In some examples, the group III nitride material multi-layer structure may be a porous structure to increase the reflectivity of the group III nitride material multi-layer structure. Alternatively, when the first epitaxial structure 1 is provided, the reflector layer 13, the first semiconductor layer 101, the first light-emitting layer 103, and the second semiconductor layer 102 are sequentially formed on the first substrate 9. In some examples, the reflector layer 13 may include the group III nitride material multi-layer structure, where the group III nitride material multi-layer structure includes multiple layers formed by materials such as AlGaN/GaN. In some examples, the group III nitride material multi-layer structure can be a porous structure to increase the reflectivity of the III nitride material multi-layer structure.

Fourth Embodiment and Fifth Embodiment

The fourth embodiment of the present disclosure provides a semiconductor structure as shown in FIG. 9 and FIGS. 10A to 10C. The fifth embodiment of the present disclosure provides a semiconductor structure as shown in FIGS. 11 to 12.

The semiconductor structure of the fourth embodiment and the semiconductor structure of the fifth embodiment are substantially the same as the semiconductor structure of the first embodiment, with the difference being in that, in the fourth embodiment and the fifth embodiment, the first epitaxial structure 1 and the second epitaxial structure 2 are bonded together by complementary structures.

Specifically, according to the fourth and fifth embodiments of the present disclosure, the first epitaxial structure 1 has a first patterning structure, and the second epitaxial structure 2 has a second patterning structure corresponding to the first patterning structure, and the first epitaxial structure 1 and the second epitaxial structure 2 are coupled by engaging the first patterning structure with the second patterning structure.

For example, one of the first epitaxial structure 1 and the second epitaxial structure 2 is provided with one or more first protrusions 14, the other of the first epitaxial structure 1 and the second epitaxial structure 2 is provided with one or more grooves 15 corresponding to the one or more first protrusions 14, and the first epitaxial structure 1 and the second epitaxial structure 2 are coupled by engaging the one or more first protrusions 14 with the one or more grooves 15. FIGS. 13A to 13F exemplarily illustrate three forms of the first protrusion 14 of the first epitaxial structure 1 and three forms of the groove 15 of the second epitaxial structure 2 according to embodiments of the present disclosure. In some examples, a shape of a section of the first protrusion 14 and a shape of a section of the groove 15 may be triangular, square, bar, polygonal, circular or elliptical, and the like, and the sections are parallel to the first substrate 9 or parallel to the second substrate 10.

Figure 10A:
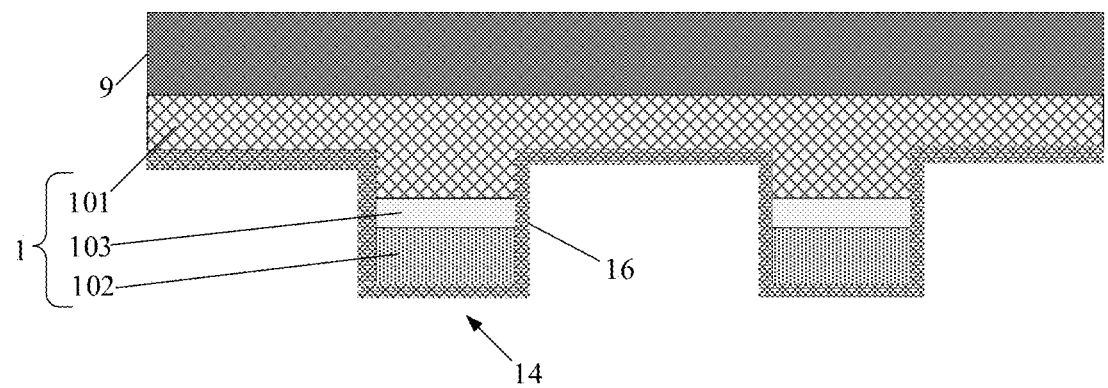
FIGS. 10A to 10C are schematic diagrams illustrating intermediate structures of the first epitaxial structure and the second epitaxial structure provided in the process of manufacturing the semiconductor structure shown in FIG. 9.
Figure 10B:
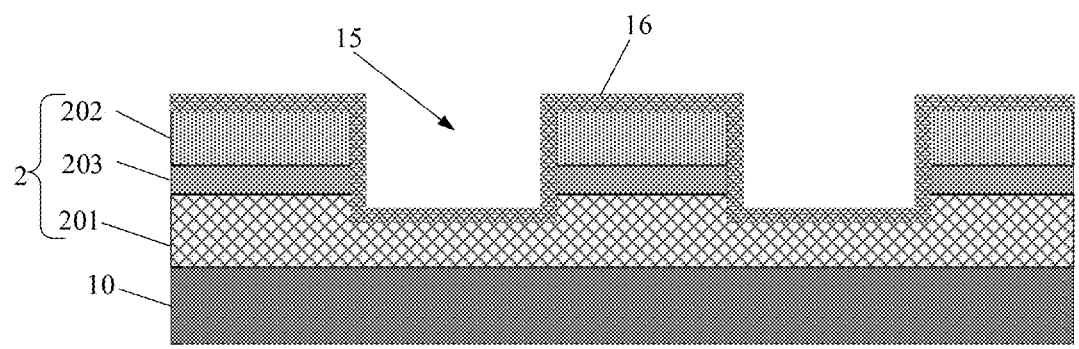
Figure 10C:
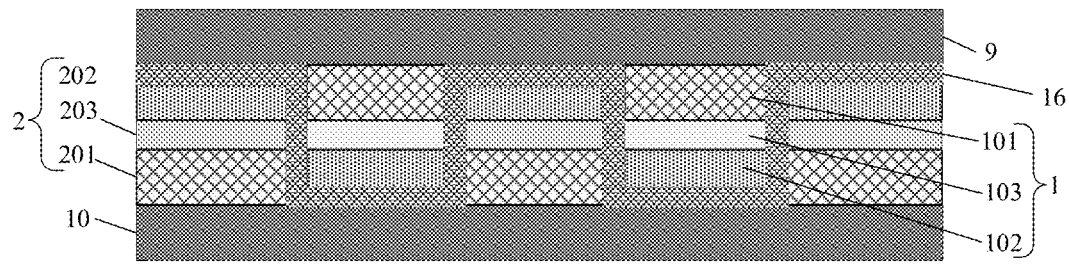
Figure 13C:
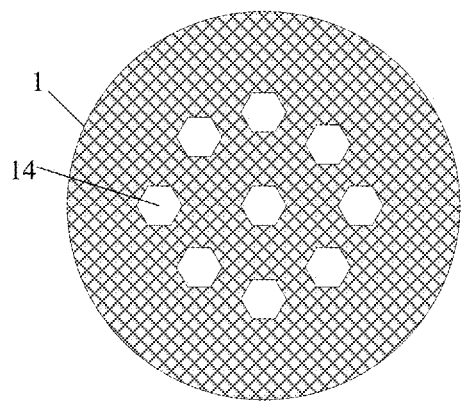
Figure 13D:
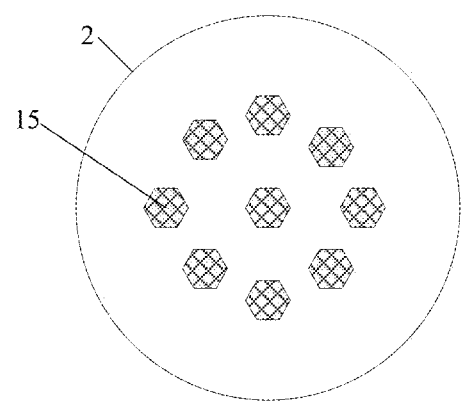
Figure 13E:
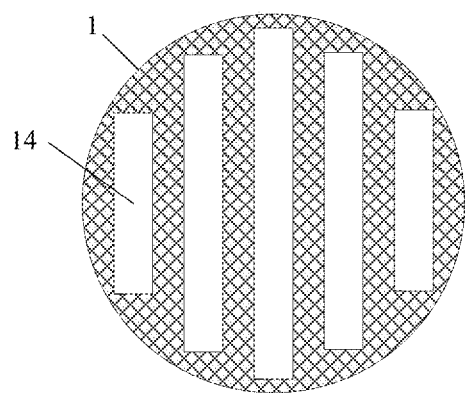
Figure 13F:
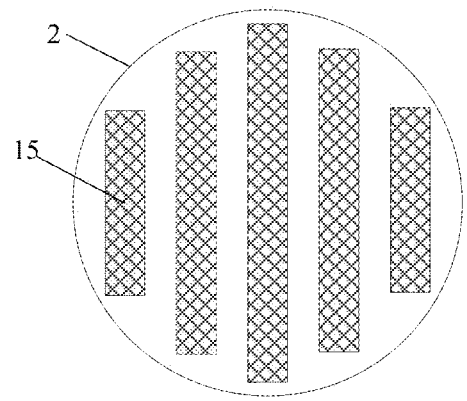

In this embodiment, the groove 15 has a depth such that the groove 15 penetrates at least the second light-emitting layer 203. In an embodiment, the groove 15 has a depth such the groove 15 further penetrates the third semiconductor layer 201 or does not penetrate the third semiconductor layer 201. When the groove 15 does not penetrate the third semiconductor layer 201, the bottom of the groove 15 reaches the surface of the third semiconductor layer 201 or the groove 15 passes through a portion of the third semiconductor layer 201, that is, the third semiconductor layer 201 is not fully etched and the third semiconductor layer 201 of the second epitaxial structure 2 is coupled to each second light-emitting layer 203 to allow each second light-emitting layer 203 to share the electrode, thereby the manufacture of electrode is simplified. FIG. 10A and FIG. 10B illustrate a case where the groove 15 does not penetrate the third semiconductor layer 201. FIG. 10C is a schematic diagram illustrating a structure after bonding the first epitaxial structure 1 to the second epitaxial structure 2 in a case where the groove 15 penetrates the third semiconductor layer 201.

The semiconductor structure of the fourth embodiment and the semiconductor structure of the fifth embodiment are substantially the same, with the difference being only that, the relative position relationship between the second semiconductor layer 102 and the fourth semiconductor layer 202 of the fourth embodiment is different from that of the fifth embodiment.

Figure 9:
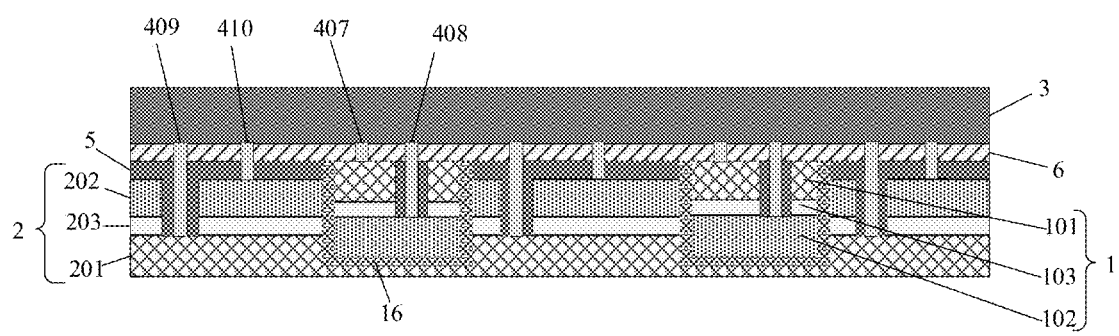
FIG. 9 is a schematic diagram illustrating a semiconductor structure according to a fourth embodiment of the present disclosure.

As shown in FIG. 9, in the fourth embodiment, after the first epitaxial structure 1 is engaged with the second epitaxial structure 2, the second semiconductor layer 102 and the fourth semiconductor layer 202 are not at the same horizontal position, and the first semiconductor layer 101 is coupled to the driving substrate 3 by the seventh electrode 407, the second semiconductor layer 102 is coupled to the driving substrate 3 by the eighth electrode 408, the third semiconductor layer 201 is coupled to the driving substrate 3 by the ninth electrode 409, and the fourth semiconductor layer 202 is coupled to the driving substrate 3 by the tenth electrode 410. The first semiconductor layer 101, the second semiconductor layer 102, the third semiconductor layer 201, and the fourth semiconductor layer 202 are coupled to the driving substrate 3 by different electrodes to achieve independent control of the first light-emitting layer 103 and the second light-emitting layer 203.

As shown in FIG. 11 and FIG. 12, in the fifth embodiment, the second semiconductor layer 102 and the fourth semiconductor layer 202 are at the same horizontal position, and the second semiconductor layer 102 and the fourth semiconductor layer 202 adjacent to the second semiconductor layer 102 are exposed simultaneously by the third channel 17, so that the second semiconductor layer 102 and the fourth semiconductor layer 202 adjacent to the second semiconductor layer 102 are jointly coupled to the driving substrate 3 by the fourth electrode 404, where the first epitaxial structure 1 is located on a side of the second light-emitting layer 203 near the driving substrate 3, and the wavelength of light emitted the first light-emitting layer 103 is greater than that of the second light-emitting layer 203 to avoid the second light-emitting layer 203 from absorbing the light emitted from the first light-emitting layer 103, thereby to avoid the second light-emitting layer 203 from causing crosstalk to the light emitted from the first light-emitting layer 103 and ensure the uniformity of the wavelength of light from the first epitaxial structure 1 after transmitting the light from the first light-emitting layer 103 for the subsequent manufacture of the full-colour LED structure.

In the fourth and fifth embodiments, the first epitaxial structure 1 is provided with a passivation layer 16 between the first epitaxial structure 1 and the second epitaxial structure 2. The material of the passivation layer 16 may be $SiO_2$ or SiN, etc.

In the fourth and fifth embodiments, a protection layer 6 is provided between an overall structure formed by coupling the first epitaxial structure 1 and the second epitaxial structure 2 and the driving substrate 3.

A method for manufacturing the semiconductor structure of the fourth and fifth embodiments is substantially the same as the method of the first embodiment, with the difference being only in that, in the fourth and fifth embodiments, before coupling the second epitaxial structure 2 to the first epitaxial structure 1, the method further includes: patterning the first epitaxial structure 1 and the second epitaxial structure 2, such that the first epitaxial structure 1 has a first patterning structure and the second epitaxial structure 2 has a second patterning structure corresponding to the first patterning structure, such that the first epitaxial structure 1 is bonded to the second epitaxial structure 2 by engaging the first patterning structure with the second patterning structure.

In this embodiment, before bonding the first epitaxial structure 1 to the second epitaxial structure 2, the passivation layer 16 is manufactured on the surfaces of both the first epitaxial structure 1 and the second epitaxial structure 2, and the material of the passivation layer 16 is a dielectric material such as $SiO_2$ or SiN.

Sixth Embodiment

Figure 14:
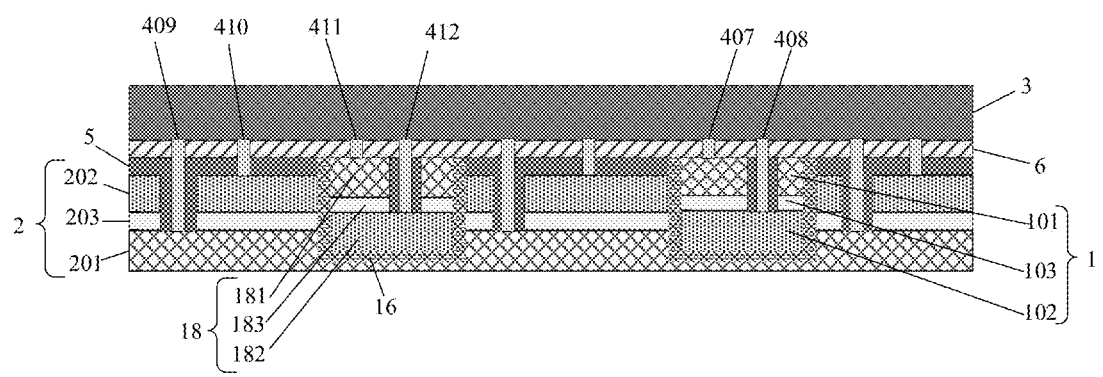
FIG. 14 is a schematic diagram illustrating a semiconductor structure according to a sixth embodiment of the present disclosure.

A semiconductor structure of the sixth embodiment is substantially the same as that of the fourth and the fifth embodiments, with difference being only in that, as shown in FIG. 14. FIG. 14 is a schematic diagram illustrating the semiconductor structure provided in the sixth embodiment, the semiconductor structure further includes a third epitaxial structure 18 having a third patterning structure corresponding to the second epitaxial structure 2. The third epitaxial structure 18 and the second epitaxial structure 2 are coupled by the engaging the second patterning structure with the third patterning structure. The third epitaxial structure 18 is coupled to the driving substrate 3, and the third epitaxial structure 18 includes a fifth semiconductor layer 181, a third light-emitting layer 183 and a sixth semiconductor layer 182 stacked, where the fifth semiconductor layer 181 has a conductivity type opposite to that of the sixth semiconductor layer 182, and the conductivity type of the fifth semiconductor layer 181 is the same as that of the first semiconductor layer 101. Specifically, the second epitaxial structure 2 has a second patterning structure, the first epitaxial structure 1 and the third epitaxial structure 18 have a first patterning structure and a third patterning structure corresponding to the second patterning structure, respectively, and the first epitaxial structure 1 and the third epitaxial structure 18 are coupled by engaging the first patterning structure and the third patterning structure with the second patterning structure, respectively. In this embodiment, the second epitaxial structure 2 is provided with a plurality of grooves 15, the first epitaxial structure 1 is provided with one or more first protrusions 14, and the third epitaxial structure 18 is provided with one or more second protrusions 184, where the number of the groove 15 is equal to the sum of the numbers of the first protrusion 14 and the second protrusion 184, and the first protrusions 14 and the second protrusions 184 are staggered in the groove 15. In this embodiment, wavelengths of light emitted from the first epitaxial structure 1, the second epitaxial structure 2 and the third epitaxial structure 18 are different from each other, and optionally, the colours of light emitted from the first epitaxial structure 1, the second epitaxial structure 2 and the third epitaxial structure 18 are red, green and blue, respectively, to achieve a full-colour display of the semiconductor structure.

In the third epitaxial structure 18, the fifth semiconductor layer 181 is located on a side of the third epitaxial structure 18 near the driving substrate 3, the fifth semiconductor layer 181 is coupled to the driving substrate 3 by the eleventh electrode 411, and the sixth semiconductor layer 182 is coupled to the driving substrate 3 by the twelfth electrode 412. The eleventh electrode 411 and the twelfth electrode 412 can be manufactured simultaneously with the eighth electrode 408 and the ninth electrode 409 to simplify the process of manufacture.

A method for manufacturing the semiconductor structure of the sixth embodiment is substantially the same as that of the fourth and fifth embodiments, with difference being only in that, after the first epitaxial structure 1 is bonded to the second epitaxial structure 2, the third epitaxial structure 18 is provided and the third epitaxial structure 18 is patterned so that the third epitaxial structure 18 has the third patterning structure corresponding to the second patterning structure, and the third epitaxial structure 18 is bonded to the second epitaxial structure 2 by engaging the third patterning structure with the second patterning structure.

Figure 15:
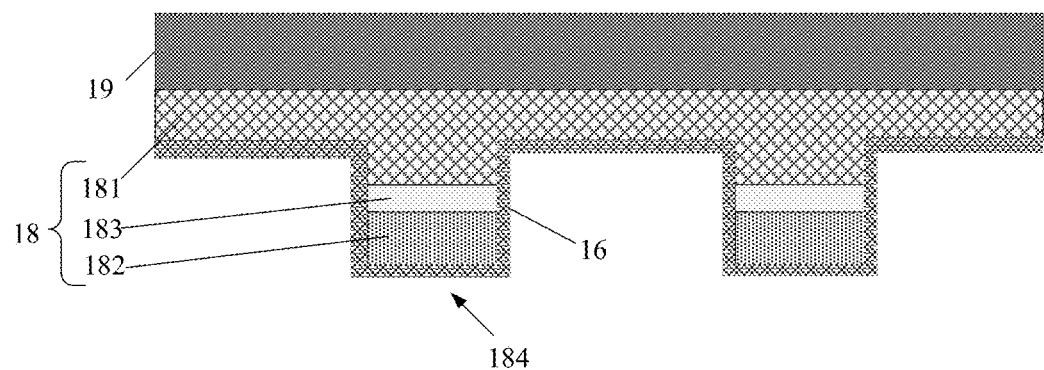
FIG. 15 is a schematic diagram illustrating an intermediate structure of the third epitaxial structure provided in the process of manufacturing the semiconductor structure shown in FIG. 14.

As shown in FIG. 15. FIG. 15 is a schematic diagram illustrating an intermediate structure of the third epitaxial structure provided in the process of manufacturing the semiconductor structure shown in FIG. 14, providing the third epitaxial structure 18 includes: providing a third substrate 19 on which the fifth semiconductor layer 181, the third light-emitting layer 183, and the sixth semiconductor layer 182 are formed in sequence, after patterning the third epitaxial structure 18 and before bonding to the second epitaxial structure 2, manufacturing a passivation layer 16 on the third epitaxial structure 18 is further included. The third epitaxial structure 18 is bonded to the second epitaxial structure 2 by engaging the third patterning structure with the second patterning structure, and the third substrate 19 is removed.

The above are the embodiments of the present disclosure, and are not intended to limit the present disclosure. Any modifications, equivalent substitutions, improvements, etc. made within the spirit and principles of the present disclosure will be included within the scope of protection of the present disclosure.

What is claimed is:
1. A semiconductor structure, comprising:
a driving substrate,
a first epitaxial structure, coupled to the driving substrate, wherein the first epitaxial structure comprises a first semiconductor layer, a second semiconductor layer and a first light-emitting layer disposed between the first semiconductor layer and the second semiconductor layer, the first semiconductor layer has a conductivity type opposite to that of the second semiconductor layer, and the first semiconductor layer is disposed between the second semiconductor layer and the driving substrate; and a second epitaxial structure, coupled to the first epitaxial structure, wherein the second epitaxial structure comprises a third semiconductor layer, a fourth semiconductor layer and a second light-emitting layer disposed between the third semiconductor layer and the fourth semiconductor layer, the third semiconductor layer has a conductivity type opposite to that of the fourth semiconductor layer, the conductivity type of the second semiconductor layer is the same as that of the fourth semiconductor layer, and the fourth semiconductor layer is disposed between the third semiconductor layer and the driving substrate, wherein the fourth semiconductor layer and the first epitaxial structure are laterally adjacent along a first direction, such that the fourth semiconductor layer overlaps one of the first semiconductor layer or the second semiconductor layer in the first direction, wherein the first epitaxial structure is disposed between the third semiconductor layer and the driving substrate, and wherein the driving substrate is selectively coupled to at least one of the first semiconductor layer, the second semiconductor layer, the third semiconductor layer and the fourth semiconductor layer by metal electrodes to independently control the first epitaxial structure and the second epitaxial structure.

2. The semiconductor structure of claim 1, wherein the driving substrate is coupled to the first semiconductor layer, the third semiconductor layer and one of the second semiconductor layer and the fourth semiconductor layer by the metal electrodes.

3. The semiconductor structure of claim 2, further comprising:
a first channel, wherein the first channel extends from a surface of the first semiconductor layer to the second semiconductor layer or the fourth semiconductor layer such that the driving substrate is coupled to the second semiconductor layer or the fourth semiconductor layer by a first electrode in the first channel; and
a second channel, wherein the second channel extends from the surface of the first semiconductor layer to the third semiconductor layer such that the driving substrate is coupled to the third semiconductor layer by a second electrode in the second channel, and the driving substrate is directly coupled to the first semiconductor layer by a third electrode.

4. The semiconductor structure of claim 3, further comprising an insulating layer, which is disposed on the surface of the first semiconductor layer and on surfaces of inner side walls of the first channel and the second channel.

5. The semiconductor structure of claim 1, wherein the first epitaxial structure has a first patterning structure, the second epitaxial structure has a second patterning structure corresponding to the first patterning structure, and the first epitaxial structure and the second epitaxial structure are coupled to each other by engaging the first patterning structure with the second patterning structure.

6. The semiconductor structure of claim 5, wherein the second semiconductor layer is laterally adjacent and overlaps with the fourth semiconductor layer in the first direction, the second semiconductor layer and the fourth semiconductor layer are exposed simultaneously through a third channel such that the second semiconductor layer and the fourth semiconductor layer are jointly coupled to the driving substrate by a fourth electrode, and the first semiconductor layer and the third semiconductor layer are coupled to the driving substrate by a fifth electrode and a sixth electrode, respectively.

7. The semiconductor structure of claim 5, wherein the first semiconductor layer is coupled to the driving substrate by a seventh electrode, the second semiconductor layer is coupled to the driving substrate by an eighth electrode, the third semiconductor layer is coupled to the driving substrate by a ninth electrode, and the fourth semiconductor layer is coupled to the driving substrate by a tenth electrode.

8. The semiconductor structure of claim 5, further comprising a passivation layer, which is disposed between the first epitaxial structure and the second epitaxial structure.

9. The semiconductor structure of claim 5, further comprising a third epitaxial structure, having a third patterning structure corresponding to the second patterning structure, wherein the third epitaxial structure and the second epitaxial structure are coupled to each other by engaging the second patterning structure with the third patterning structure.

10. The semiconductor structure of claim 9, wherein the third epitaxial structure is coupled to the driving substrate, the third epitaxial structure comprises a fifth semiconductor layer, a third light-emitting layer and a sixth semiconductor layer stacked, the fifth semiconductor layer is disposed between the sixth semiconductor layer and the driving substrate, the fifth semiconductor layer has a conductivity type opposite to that of the sixth semiconductor layer, and wavelengths of light emitted from the first light-emitting layer, the second light-emitting layer and the third light-emitting layer are different from each other.

11. The semiconductor structure of claim 1, further comprising a protection layer disposed between the first epitaxial structure and the driving substrate and between the second epitaxial structure and the driving substrate.

12. The semiconductor structure of claim 1, wherein materials of the first semiconductor layer, the second semiconductor layer, the third semiconductor layer and the fourth semiconductor layer comprise a group III nitride material.

13. A method for manufacturing a semiconductor structure, comprising:
providing a first epitaxial structure, wherein the first epitaxial structure comprises a first semiconductor layer, a second semiconductor layer and a first light-emitting layer disposed between the first semiconductor layer and the second semiconductor layer, and the first semiconductor layer has a conductivity type opposite to that of the second semiconductor layer;
providing a second epitaxial structure coupled to the first epitaxial structure, wherein the second epitaxial structure comprises a third semiconductor layer, a fourth semiconductor layer and a second light-emitting layer disposed between the third semiconductor layer and the fourth semiconductor layer, the third semiconductor layer has a conductivity type opposite to that of the fourth semiconductor layer, and the conductivity type of the second semiconductor layer is the same as that of the fourth semiconductor layer;
selectively exposing the first semiconductor layer, the second semiconductor layer, the third semiconductor layer and the fourth semiconductor layer by etching;
providing a driving substrate bonded to the first epitaxial structure and the second epitaxial structure;

wherein the first semiconductor layer is disposed between the second semiconductor layer and the driving substrate, wherein the fourth semiconductor layer is disposed between the third semiconductor layer and the driving substrate, wherein the fourth semiconductor layer and the first epitaxial structure are laterally adjacent along a first direction, such that the fourth semiconductor layer overlaps one of the first semiconductor layer or the second semiconductor layer in the first direction, wherein the first epitaxial structure is disposed between the third semiconductor layer and the driving substrate, and selectively coupling the driving substrate to at least one of the first semiconductor layer, the second semiconductor layer, the third semiconductor layer and the fourth semiconductor layer by metal electrodes to independently control the first epitaxial structure and the second epitaxial structure.

14. The method of claim 13, wherein the second epitaxial structure is coupled to the first epitaxial structure by a passivation layer.

15. The method of claim 13, further comprising, before coupling the second epitaxial structure to the first epitaxial structure:

patterning the first epitaxial structure and the second epitaxial structure, such that the first epitaxial structure has a first patterning structure and the second epitaxial structure has a second patterning structure corresponding to the first patterning structure, and the first epitaxial structure and the second epitaxial structure are coupled to each other by engaging the first patterning structure with the second patterning structure.

16. The method of claim 15, further comprising, after coupling the first epitaxial structure and the second epitaxial structure by engaging the first patterning structure with the second patterning structure:

providing a third epitaxial structure;

patterning the third epitaxial structure, such that the third epitaxial structure has a third patterning structure corresponding to the second patterning structure; and bonding the third epitaxial structure to the second epitaxial structure by engaging the third patterning structure with the second patterning structure.

17. The method of claim 13, wherein, providing the first epitaxial structure comprises: providing a first substrate, and forming the first semiconductor layer, the first light-emitting layer and the second semiconductor layer sequentially on the first substrate, providing the second epitaxial structure comprises: providing a second substrate, and forming the third semiconductor layer, the second light-emitting layer and the fourth semiconductor layer sequentially on the second substrate, the method further comprises, after coupling the second epitaxial structure to the first epitaxial structure: removing the first substrate and the second substrate.

\* \* \* \* \*